(12) United States Patent
Joseph et al.

(10) Patent No.: US 7,521,327 B2
(45) Date of Patent: Apr. 21, 2009

(54) HIGH $F_T$ AND $F_{MAX}$ BIPOLAR TRANSISTOR AND METHOD OF MAKING SAME

(75) Inventors: Alvin Jose Joseph, Williston, VT (US); Qizhi Liu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 11/378,927

(22) Filed: Mar. 17, 2006

(65) Prior Publication Data

US 2006/0177986 A1 Aug. 10, 2006

Related U.S. Application Data

(62) Division of application No. 10/604,045, filed on Jun. 24, 2003, now Pat. No. 7,038,298.

(51) Int. Cl.
*H01L 21/331* (2006.01)
(52) U.S. Cl. ............... 438/309; 438/234; 438/367; 438/366; 257/E21.609; 257/565; 257/592
(58) Field of Classification Search ........... 438/309, 438/234, 367, 366; 257/198, 565, 592, E21.609
See application file for complete search history.

(56) References Cited

U.S. PATENT DOCUMENTS

| 4,752,817 A | 6/1988 | Lechaton et al. ............ 357/34 |
| 5,008,207 A | 4/1991 | Blouse et al. ............ 438/312 |
| 5,024,957 A | 6/1991 | Harame et al. ............ 438/367 |
| 5,144,403 A | 9/1992 | Chiang et al. | |
| 5,232,861 A | 8/1993 | Miwa ............ 438/366 |
| 5,352,617 A | 10/1994 | Miwa ............ 438/234 |
| 5,436,180 A | 7/1995 | de Fresart et al. ............ 437/31 |

(Continued)

FOREIGN PATENT DOCUMENTS

EP 0701287 3/1996

(Continued)

OTHER PUBLICATIONS

Supplementary European Search Report dated Jan. 29, 2009, regarding related 04755817.6 - 1235/1644973; PCT/US2004019906.

*Primary Examiner*—Marcos D. Pizarro
*Assistant Examiner*—Eva Y. Montalvo
(74) *Attorney, Agent, or Firm*—Downs Rachlin Martin PLLC

(57) ABSTRACT

A high $f_T$ and $f_{max}$ bipolar transistor includes an emitter, a base, and a collector. The emitter has a lower portion and an upper portion that extends beyond the lower portion. The base includes an intrinsic base and an extrinsic base. The intrinsic base is located between the lower portion of the emitter and the collector. The extrinsic base extends from the lower portion of the emitter beyond the upper portion of the emitter and includes a continuous conductor that extends from underneath the upper portion of the emitter and out from underneath the upper portion of the emitter. The continuous conductor provides a low electrical resistance path from a base contact (not shown) to the intrinsic base. The transistor may include a second conductor that does not extend underneath the upper portion of the emitter, but which further reduces the electrical resistance through the extrinsic base.

19 Claims, 5 Drawing Sheets

U.S. PATENT DOCUMENTS

| | | | |
|---|---|---|---|
| 5,624,856 A | 4/1997 | Li et al. | 438/339 |
| 5,962,880 A | 10/1999 | Oda et al. | 257/198 |
| 6,028,345 A | 2/2000 | Johnson | 257/592 |
| 6,117,744 A * | 9/2000 | Ammo | 438/309 |
| 6,262,472 B1 | 7/2001 | Gregory | 257/592 |
| 6,265,275 B1 * | 7/2001 | Marty et al. | 438/309 |
| 6,316,818 B1 | 11/2001 | Marty et al. | 257/592 |
| 6,333,236 B1 | 12/2001 | Koganei | 438/312 |
| 6,362,066 B1 | 3/2002 | Ryum et al. | 438/364 |
| 6,579,773 B2 | 6/2003 | Norstrom et al. | |
| 2002/0058388 A1 | 5/2002 | Ryum et al. | 438/364 |
| 2003/0006484 A1 | 1/2003 | Asai et al. | 257/565 |

FOREIGN PATENT DOCUMENTS

| | | |
|---|---|---|
| WO | WO99/52138 | 10/1999 |

* cited by examiner

HIGH $F_T$ AND $F_{MAX}$ BIPOLAR TRANSISTOR AND METHOD OF MAKING SAME

RELATED APPLICATION DATA

This application is a division of U.S. patent application Ser. No. 10/604,045, filed Jun. 24, 2003, and titled "High $f_T$ and $f_{max}$ Bipolar Transistor and Method of Making Same," which is incorporated by reference herein in its entirety.

FIELD OF THE INVENTION

The present invention relates generally to the field of microelectronic semiconductor devices. More particularly, the present invention is directed to a high fT and fmax bipolar transistor and method of making the same.

BACKGROUND OF THE INVENTION

With each generation of microelectronic semiconductor devices, e.g., microprocessors, memories, application specific integrated circuits, and other devices, the speed at which these devices operate increases incrementally. In the same technology node, SiGe heterojunction bipolar transistor (HBT) devices have higher speeds than the field effect transistors (FET) in a CMOS technology. Due to this higher speed performance of SiGe HBTs and other related reasons, bipolar complimentary metallic oxide semiconductor (BiCMOS) fabrication is finding more use in a variety of application in semiconductor devices.

A conventional BiCMOS bipolar transistor 20 is shown in FIG. 1. Transistor 20 shown is an n-p-n transistor having an n-type emitter 24, a p-type base 28, and an n-type collector generally represented by doped collector pedestal 32 formed in a wafer 36. In addition to collector pedestal 32, wafer 36 includes a first deep trench insulator 40 and a second shallow trench isolator (STI) 44 for isolating transistor 20 from surrounding microelectronic components (not shown), e.g., other transistors, capacitors, or the like. A heavily-doped sub-collector 48 underneath the collector pedestal and the STI 44 provides a low-resistance link to collector contact (not shown). Emitter 24 often generally has a T-shaped vertical cross section so as to provide a relatively small lower portion 52 proximate collector pedestal 32 (to achieve a small cross-sectional area to limit the current flow to the collector) while providing a relatively large upper portion 56 to interface with an emitter contact 58.

Base 28 typically comprises an intrinsic base 60 that includes a thin, generally highly p-doped layer (not shown) located between emitter and collector and an extrinsic base 64 that provides an electrical pathway between a base contact (not shown) and the intrinsic base. During the process of fabricating transistor 20, extrinsic base 64 is typically made by depositing a polysilicon layer 68 atop wafer 36. Subsequently, polysilicon layer 68 is etched to provide a trench 72 for lower portion 52 of emitter 24, and then the emitter is formed. After emitter 24 is formed, polysilicon layer 68 is silicidated with a metal to form a conductor 76 so as to increase the conductance of extrinsic base 64. However, because emitter 24 has already been formed, the portion 80 of extrinsic base 64 beneath emitter 24 is not silicidated due to the presence of the emitter above that blocks metal atom from reaching this portion of the extrinsic base.

The fact that portion 80 of extrinsic base 64 remains unsilicidated is significant because the resistance $R_{poly}$ of the polysilicon in this portion is much higher than the resistance $R_{silicide}$ of its silicidated counterpart located out from underneath emitter 24. For example, $R_{poly}$ may be about 100-200 $\Omega$/sq for a 1000 Å thickness, whereas $R_{silicide}$ for one-third of the thickness may be about 8 $\Omega$/sq. Because $R_{poly}$ is relatively high, the resistance to current flowing through extrinsic base 64 is relatively high.

As device feature size scales down with advancement in technology, high-speed SiGe HBTs have thinner base to reduce the transit time of electrons to go from emitter to collector, thus increase the unity current gain frequency $f_T$. A thinner base, however, increases the base resistance, limiting maximum achievable oscillation frequency $f_{max}$, which is also necessary for high speed application of the devices. Thus it is important to innovate ways to reduce base resistance $R_b$

SUMMARY OF INVENTION

In one aspect, the present invention is directed to a bipolar device comprising a substrate having a collector and an emitter spaced from the collector. A base has a first portion located between the substrate and the emitter and a second portion surrounding the first portion. The base includes a first conductor located within the first and second portions and has a first conductance in the first portion and a second conductance in the second portion. The first conductance and the second conductance are substantially the same as one another.

In another aspect, the present invention is directed to a method of forming a bipolar device on a substrate having a collector comprising the step of forming an intrinsic base layer on the substrate. A first conductor is then formed above the intrinsic base layer. The first conductor has a substantially uniform conductance throughout. An emitter having at least a portion thereof extending over a portion of the first conductor is formed.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 2:
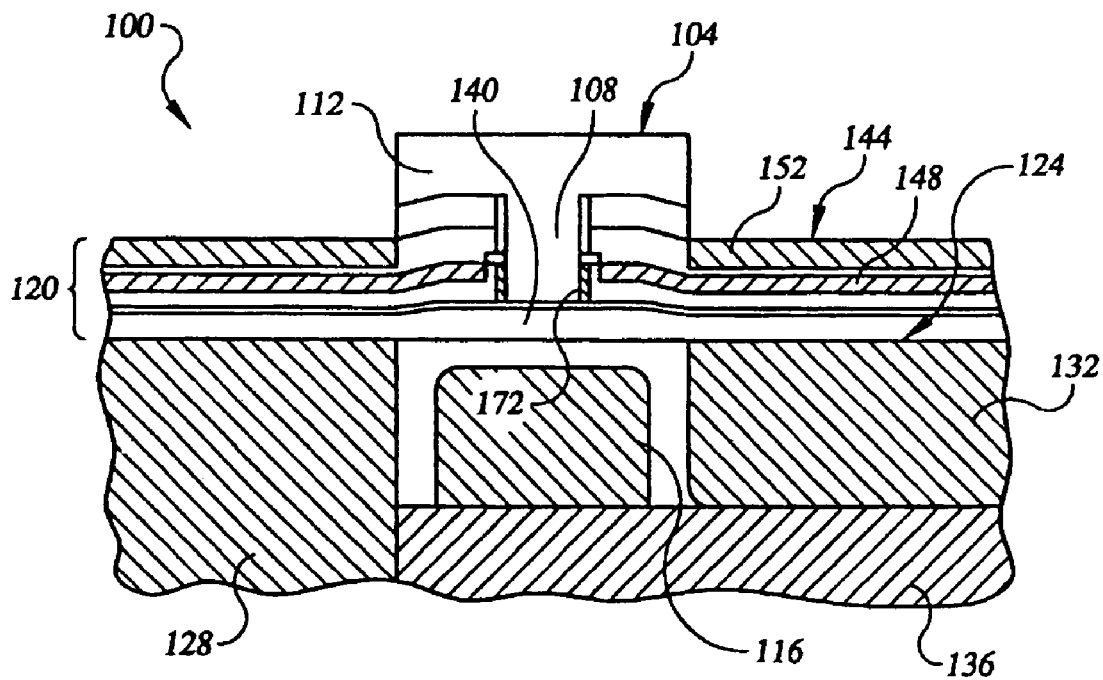
FIG. 2 is a cross-sectional view of a transistor made in accordance with the present invention, wherein the transistor has a generally T-shaped emitter and the portion of the extrinsic base beneath the emitter has a relatively low electrical resistance.

Referring now to the drawings, FIG. 2 shows in accordance with the present invention a BiCMOS transistor, which is identified generally by the numeral 100. Transistor 100 may include an emitter 104, e.g., a T-shaped emitter having a lower portion 108 and an upper portion 112, a collector (illustrated by collector pedestal 116 and heavily-doped sub-collector), and a base 120. Transistor 100 may be formed on a substrate 124, such as a wafer, in which collector pedestal 116 is formed, usually by ion implantation. Substrate 124 may also include one or more shallow and/or deep trench isolations 128, 132, and a sub-collector 136 providing electrical communication between collector pedestal 116 and a collector contact (not shown). Base 120 generally includes an intrinsic base 140 located between lower portion 108 of emitter 104 and collector pedestal 116. Intrinsic base 140 may be formed from a plurality of epitaxial silicon layers, at least one of which may be relatively heavily doped with a doping type opposite the doping type of emitter 104 and collector pedestal 116. For example, if transistor 100 is of the n-p-n type, emitter 104 and collector pedestal 116 would have an n-type doping and intrinsic base 140 would include a p-type doping. Of course, if transistor 100 were of the p-n-p type, the doping types would be reversed.

Figure 1:
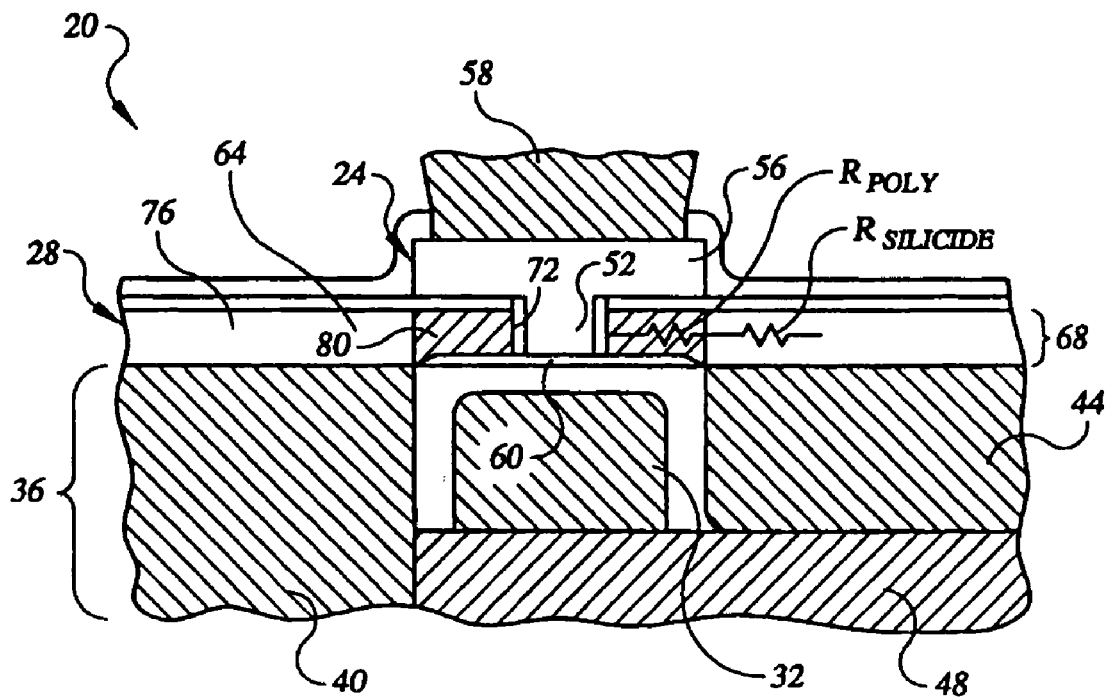
FIG. 1 is cross-sectional view of a prior art transistor having a generally T-shaped emitter illustrating the relatively high electrical resistance in the portion of an extrinsic base located beneath the emitter.

Base 120 further includes an extrinsic base 144 that may include a plurality of layers, one of which is a conductive layer forming a continuous conductor 148 extending from underneath upper portion 112 of emitter 104 proximate lower portion 108 of the emitter to a location out from underneath the emitter. Conductor 148 has substantially the same conductance underneath upper portion 112 of emitter 104 as it does out from underneath the emitter. Conductor 148 may comprise a silicide or other material having a relatively low resistance, e.g., when compared to the resistance of polysilicon. Importantly, conductor 148 extends beneath upper portion 112 of emitter 104. This is important because conductor 148 has a relatively low electrical resistance compared to the resistance of polysilicon portion 80 underneath emitter 24 of exemplary conventional transistor 100 shown in FIG. 1. As mentioned in the Background section above, typical resistances through a silicide and polysilicon are typically on the order of about 8 Ω/sq for a 300 Å thickness and about 100-200 Å/sq for a 1000 Å thickness, respectively.

Significantly, the relatively low resistance to current flow in the portion of conductor 148 underneath upper portion 112 of emitter 104 provides transistor 100 with a high unity current gain cutoff frequency $f_T$, e.g., 200 GHz or more, and a high maximum oscillation frequency $f_{max}$, e.g., 250 GHz or more. To further enhance the conductance of extrinsic base 144, the extrinsic base may include a second conductor 152, which may also be formed using a silicidation process.

Figure 3:
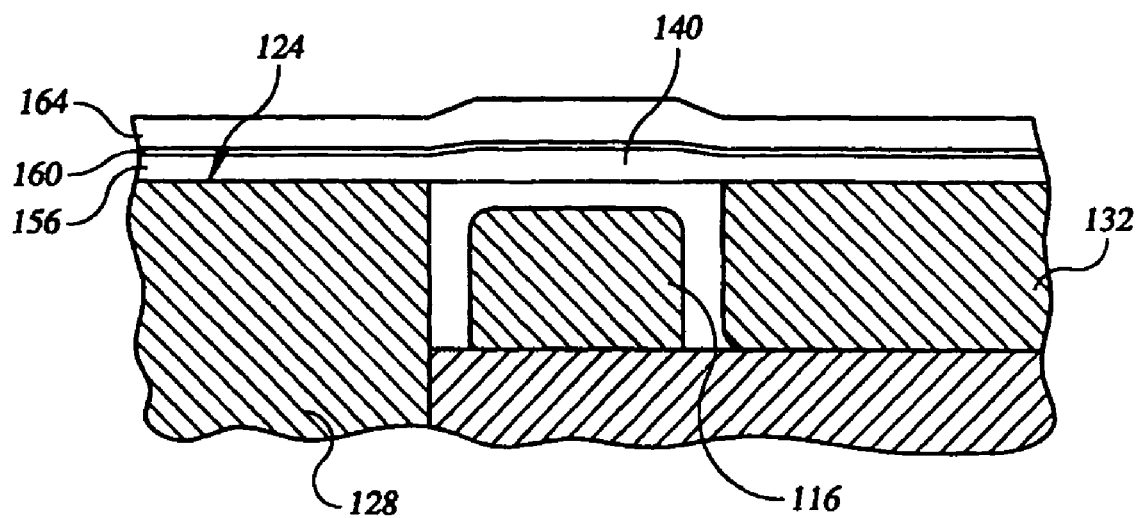
FIG. 3 is a cross-sectional view of the transistor of FIG. 2 during fabrication illustrating the growth of an intrinsic base layer, an i-Si layer, and a first part of an extrinsic base.

FIGS. 3-10 illustrate various steps of one method of fabricating transistor 100 so that conductor 148 (FIG. 2) is present both underneath, and out from underneath, upper portion 112 of emitter 104 so as to produce transistor 100 having high $f_T$ and $f_{max}$ values. Referring to FIG. 3, and also to FIG. 2, substrate 124 having isolations, 128, 132 and collector pedestal 116 formed therein using well-known techniques may be provided. Substrate 124 may be a conventional wafer, such as a lightly-doped silicon wafer. An intrinsic base layer 156 may be formed on the surface of substrate 124, e.g., using low temperature epitaxy (LTE) techniques that are well known in the art, so as to provide intrinsic base 140. Intrinsic base layer 156 may include a plurality of layers (not shown) comprising Si and/or Ge that may include at least one relatively heavily doped layer that provides a region of doping complementary to the doping of emitter 104 (FIG. 2) and collector pedestal 116.

After intrinsic base layer 156 has been formed, an intentionally undoped layer 160, e.g., intrinsic silicon (i-Si), may be grown on the surface of the intrinsic base layer. Undoped layer 160 will be used in later steps as an oxidation and etch stop, as discussed below. Following growth of undoped layer 160, a first extrinsic base layer 164 may be grown on top of the undoped layer using, e.g., conventional LTE techniques. First extrinsic base layer 164 may be, e.g., Si or SiGe that is heavily doped in-situ.

Figure 4:
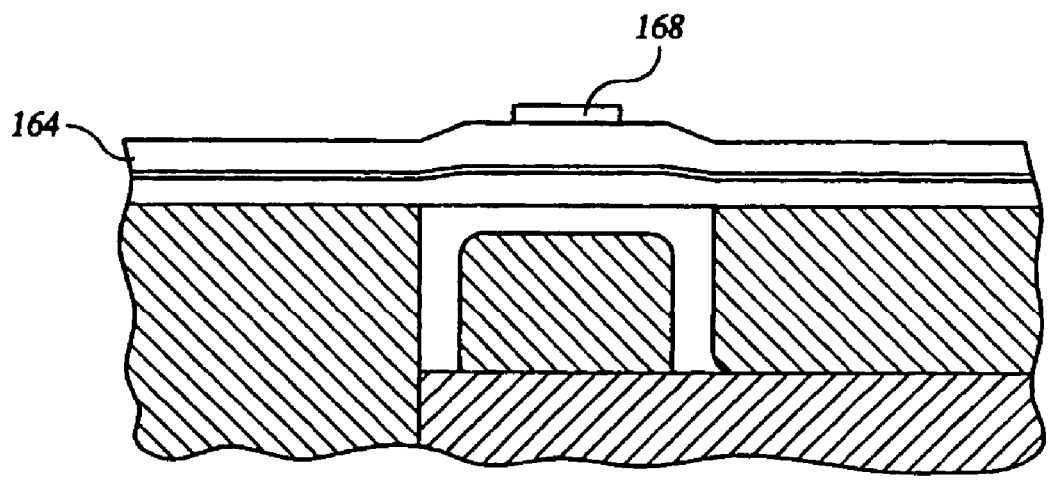
FIG. 4 is a cross-sectional view of the transistor of FIG. 2 during fabrication illustrating the formation of a dielectric landing pad on the first part of the extrinsic base.

Referring to FIG. 4, and also to FIG. 2, FIG. 4 illustrates the formation of a landing pad 168 on the surface of first extrinsic base layer 164 at the general region of the intrinsic portion of transistor 100 (i.e., the n-p-n or p-n-p junction region). Landing pad 168 will be used in subsequent steps as a mask in the step of forming conductor 148 and an etch stop in the process of forming a trench 172 for emitter 104. Landing pad 168 may comprise a dielectric material, such as a single layer or stack of $SiO_2$ and/or SiN or SiON. If $SiO_2$ is used, a chemical oxide removal (COR) etch may be used to minimize lateral critical dimension shrinkage. Landing pad 168 may be formed utilizing various techniques, such as PECVD deposition and thermal oxidation, photolithograph patterning, and etch techniques that are well known in the art.

Figure 5:
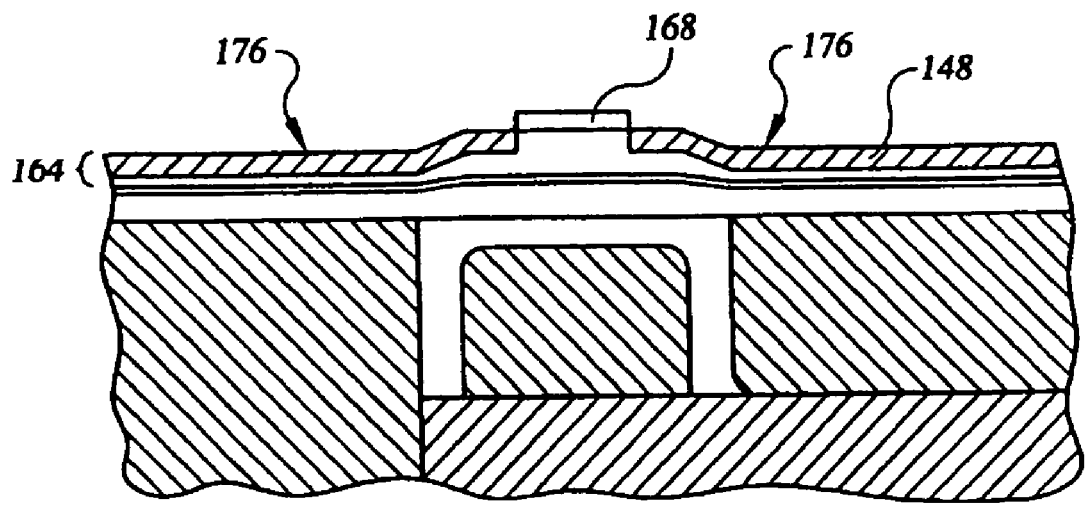
FIG. 5 is a cross-sectional view of the transistor of FIG. 2 during fabrication illustrating the silicidation of the first part of the extrinsic base.

Referring to FIG. 5, and also to FIG. 2, FIG. 5 illustrates the formation of conductor 148. In the embodiment shown, conductor 148 comprises a silicide region 176 formed by a silicide-forming process, applied to at least a portion of first extrinsic base layer 164. This process may include sputtering a single element of a metal, e.g., Co, Ti, Ni, or a combination of two or more metals with or without a nucleation element, such as Nb, followed by an anneal so as to form MSi or $MSi_2$ (M=Co, Ti, Ni, and the like). This process forms a silicide "ring," wherein silicide region 176 is present in first extrinsic base layer 164 except underneath landing pad 168. Unreacted metal present on dielectric landing pad 168 may then be stripped off, e.g., using a wet chemical strip.

Figure 6:
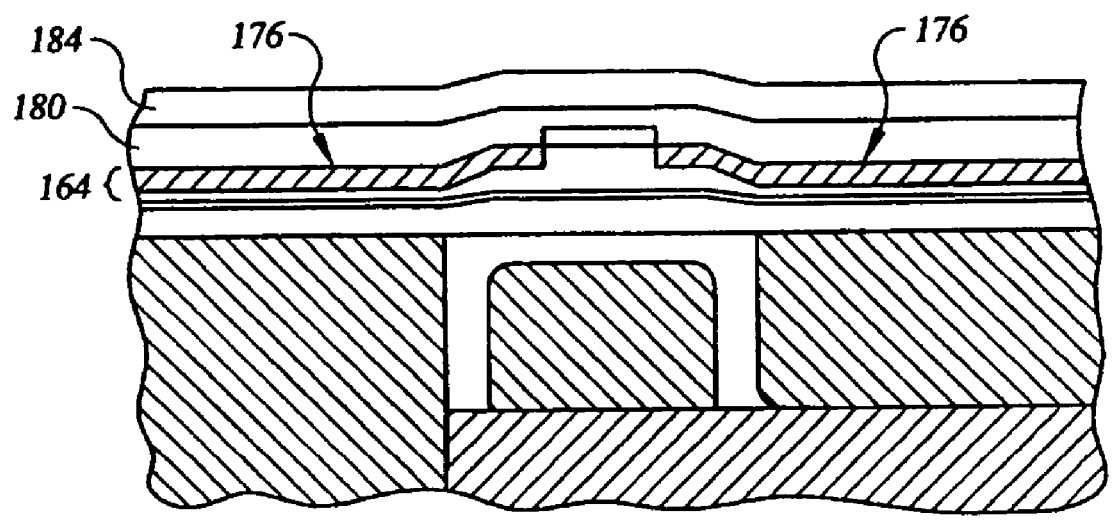
FIG. 6 is a cross-sectional view of the transistor of FIG. 2 during fabrication illustrating the growth of a second part of the extrinsic base and an isolation layer.

As seen in FIG. 6, after first extrinsic base layer 164 has been silicidated to form silicide region 176 (conductor 148 (FIG. 2)), an optional second extrinsic base layer may be provided atop first extrinsic base layer 180. Second extrinsic base layer 180 may comprise an in-situ doped polysilicon. Although second extrinsic base layer 180 is optional, it can be beneficial to minimize Si losses from silicide region 176 of first extrinsic base layer 164. A base isolation layer 184 may be provided atop second extrinsic base layer (or first if the second is not provided), e.g., using a TEOS or other $SiO_2$ forming process. Further, an optional protective layer (not shown) comprising, e.g., a polysilicon or nitride, may be provided atop base isolation layer 184 if desired.

Figure 7:
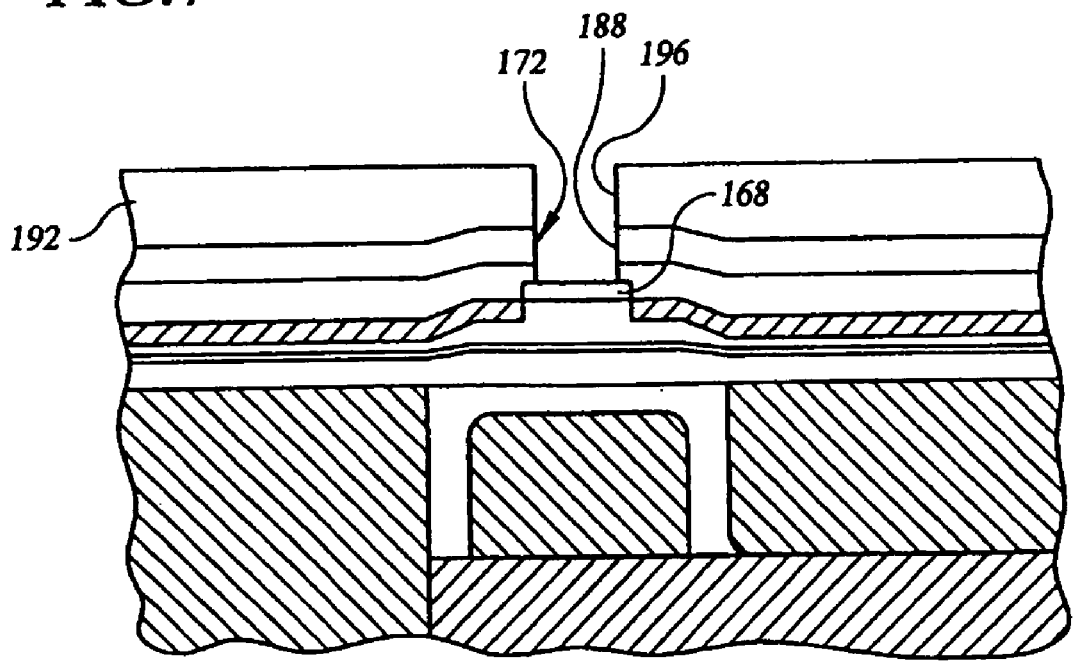
FIG. 7 is a cross-sectional view of the transistor of FIG. 2 during fabrication illustrating the formation of a trench for the emitter.

Referring to FIG. 7, and also to FIG. 2, FIG. 7 illustrates the formation of a first part 188 of emitter trench 172. To form first part 188 of emitter trench 172, a layer of photoresist 192 may be applied, exposed, and processed to form an aperture 196 therein corresponding to the emitter trench. This may be accomplished using any techniques known in the art, including anti-reflective coating techniques. After aperture 196 has been formed, the one or more layers present above landing pad 168, e.g., second extrinsic base 180, base isolation layer 184, and/or the protective layer (not shown) may be etched to form first part 188 of emitter trench 172, e.g., using a selective poly etch that stops on the landing pad. After first part 188 of emitter trench 172 has been formed, photoresist 192 may be stripped from the uppermost layer.

Figure 8:
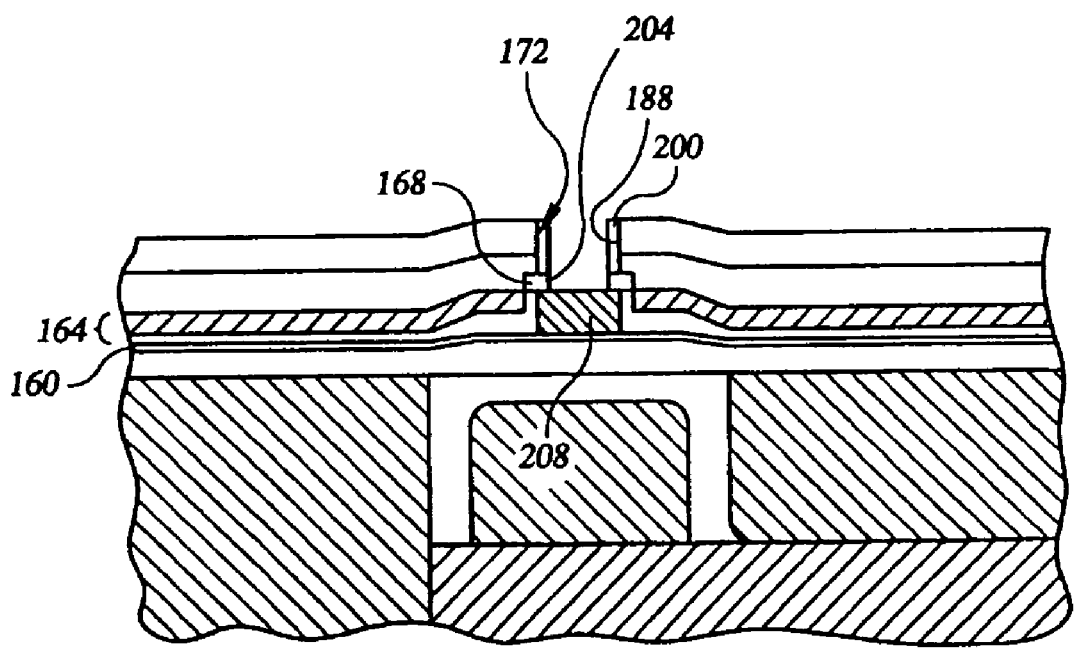
FIG. 8 is a cross-sectional view of the transistor of FIG. 2 during fabrication illustrating the formation of a nitride spacer, the etching of the landing pad, and the oxidation of a portion of the first part of the extrinsic base between the emitter trench and the intentionally undoped layer.
Figure 9:
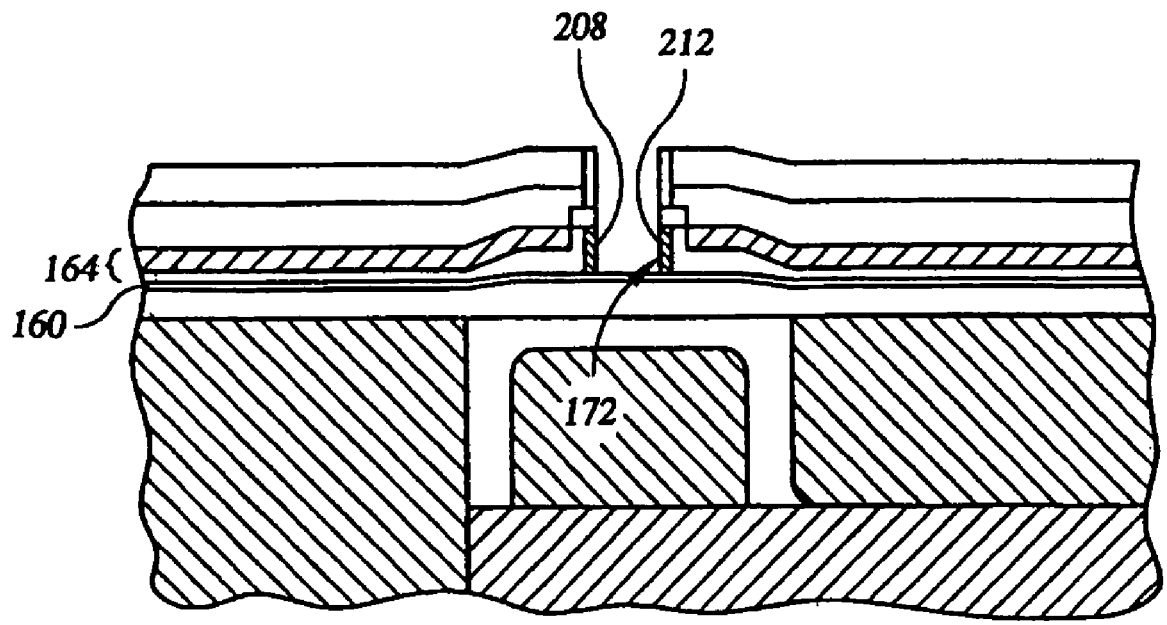
FIG. 9 is a cross-sectional view of the transistor of FIG. 2 during fabrication illustrating the etching of the oxidized portion of the first part of the extrinsic base.

Referring to FIG. 8, after upper part 188 of emitter trench 172 has been formed, a nitride spacer 200 may be formed on the walls of the first part of the trench. This may be accomplished using techniques known in the art, such as the deposition of nitride in and surrounding first part 188 of emitter trench 172 and using a directional etch to remove the unwanted nitride. Following formation of nitride spacer 200, a central portion of landing pad 168 may be removed to form an aperture 204 in the landing pad, e.g., by COR etching, which may optionally be followed by a buffered hydrofluoric acid (BHF) clean. After aperture 204 has been formed, a portion 208 of first highly-doped extrinsic base layer 164 beneath the aperture may be oxidized, e.g., using thermal oxidation, to the depth of undoped layer 160. The higher doping of first extrinsic base layer 164 causes this layer to oxidize more quickly than undoped layer 160 below. Thus, the oxidation process can be suitably timed to avoid excessive, or any, oxidation of undoped layer 160. Since first extrinsic base layer 164 becomes relatively highly oxidized, whereas undoped layer 160 does not, oxidized portion 208 of the first extrinsic base layer may be controllably etched down to the undoped layer, e.g., using a COR etch, to form a second part 212 of emitter trench 172. This is illustrated in FIG. 9. After first extrinsic base layer 164 has been etched, emitter trench 172 may be optionally cleaned using a dilute hydrofluoric acid (DHF) clean.

Figure 10:
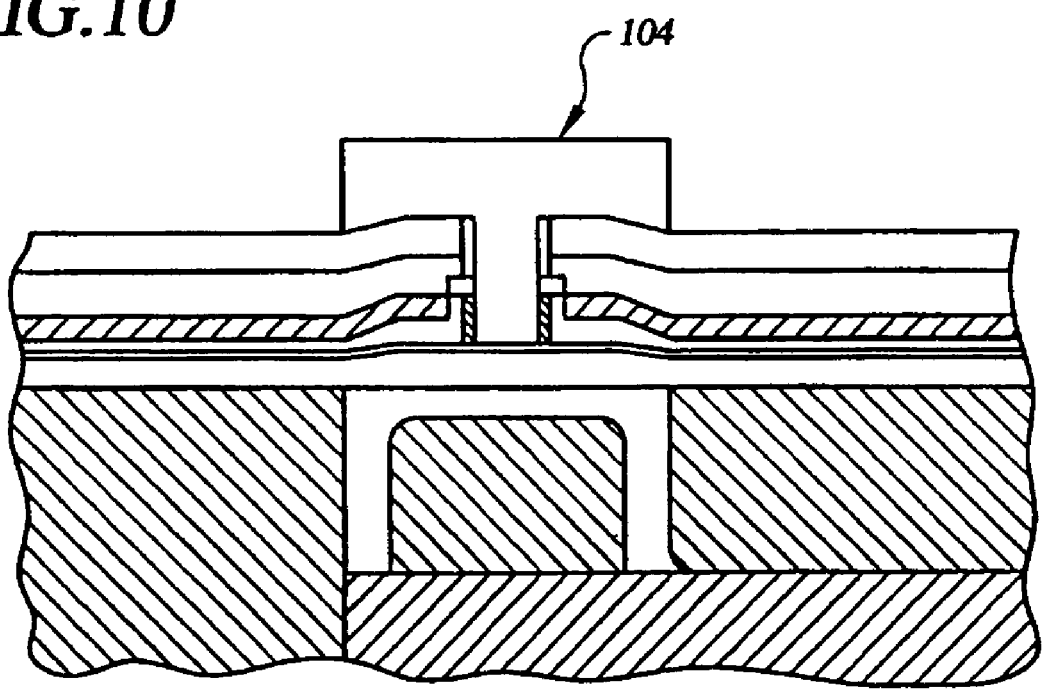
FIG. 10 is a cross-sectional view of the transistor of FIG. 2 during fabrication illustrating the formation of the emitter.

FIG. 10 illustrates the formation of emitter 104, which may be doped in-situ and formed using conventional deposition, lithography, and etching techniques. Emitter 104 may be silicided or unsilicided. Following the formation of emitter 104, an optional nitride cap layer (not shown) may be provided. Referring to FIG. 2, the layer(s) above second extrinsic base layer 180 surrounding emitter 104, e.g., base isolation layer 184 (FIG. 6) and/or protective layer (not shown), may optionally be removed, allowing the second extrinsic base layer to be silicidated in a manner similar to conventional transistors, e.g., transistor 20 of FIG. 1, wherein the silicidation occurs in the region outside from underneath upper portion of emitter 104 so as to form second conductor 152. This additional silicidation may further reduce the resistance of extrinsic base 144. Further processing of transistor 100 may proceed in accordance with conventional practices.

While the present invention has been described in connection with a preferred embodiment, it will be understood that it is not so limited. On the contrary, it is intended to cover all alternatives, modifications, and equivalents as may be included within the spirit and scope of the invention as defined above and in the claims appended hereto.

What is claimed is:

1. A method of forming a bipolar device on a substrate having a collector, comprising the steps of:
    (a) forming an intrinsic base layer on said substrate;
    (b) forming a first conductor above said intrinsic base layer, wherein said first conductor has a substantially uniform conductance throughout; and
    (c) forming an emitter having at least a portion thereof extending over a portion of said first conductor;

wherein:
    step (b) includes forming a first extrinsic base layer and silicidating said first extrinsic base layer prior to step (c) so as to form said first conductor;
    step (b) further includes forming a landing pad atop said first extrinsic base layer prior to silicidating said first extrinsic base layer;
    step (c) includes removing a portion of said landing pad to form an aperture; and
    step (c) further includes oxidizing said first extrinsic base layer beneath said aperture so as to form an oxidized region and removing at least a portion of said oxidized region to said intrinsic base layer.

2. A method according to claim 1, wherein step (a) includes forming an intentionally undoped layer.

3. A method according to claim 1, further comprising the step of forming a second extrinsic base layer above said first extrinsic base layer and performing a first etch through said second extrinsic base layer to said first extrinsic base layer and then performing a second etch through said first extrinsic base layer to said intrinsic base layer.

4. A method according to claim 1, further comprising the step of forming a second conductor that does not extend underneath said emitter.

5. A method according to claim 4, wherein said second conductor is formed by silicidation.

6. A method of forming a bipolar transistor, comprising:
    providing a substrate having a surface and a collector pedestal formed in the substrate;
    depositing an intrinsic base layer on the surface of the substrate, the intrinsic base layer having one of a p-type or n-type doping;
    depositing a first extrinsic base layer over the intrinsic base layer, the first extrinsic base layer having the other of the p-type or n-type doping;
    forming a conductive ring over the intrinsic base layer, the conductive ring having a center;
    forming an aperture in the first extrinsic base layer in the center of the conductive ring;
    forming an emitter having a lower portion located in the aperture in the first extrinsic base layer, and an upper portion extending over the conductive ring; and
    depositing an undoped silicon layer over the intrinsic base layer before said depositing of the first extrinsic base layer, wherein said forming of the aperture in the first extrinsic base layer includes utilizing the undoped silicon layer as an etch-stop.

7. A method according to claim 6, further comprising, prior to said forming of the aperture in the first extrinsic base layer, oxidizing a portion of the first extrinsic base layer, wherein the aperture is formed in the portion oxidized so as to form an insulator ring for electrically insulating the conductive ring from the emitter.

8. A method according to claim 6, further comprising, prior to said forming of the conductive ring, forming a landing pad on the first extrinsic base layer at the location of the center of the conductive ring.

9. A method according to claim 8, wherein said forming of the conductive ring includes silicidating a portion of the first extrinsic base layer using the landing pad to block silicidation of the center of the conductive ring.

10. A method according to claim 8, further comprising, after said forming of the conductive ring, depositing a second extrinsic base layer over the first extrinsic base layer and depositing a base isolation layer on the second extrinsic base layer.

11. A method according to claim 10, further comprising etching through each of the base isolation layer and second extrinsic layer to form an opening, utilizing the landing pad as an etch stop for said etching.

12. A method according to claim 11, further comprising removing a central portion of the landing pad so as to leave a remnant of the landing pad.

13. A method according to claim 6, further comprising:
prior to said forming of the aperture in the first extrinsic base layer, oxidizing a portion of the first extrinsic base layer, wherein the aperture is formed in the portion oxidized so as to form an insulator ring for electrically insulating the conductive ring from the emitter.

14. A method according to claim 13, wherein said forming of the emitter includes forming an emitter so that the lower portion further extends through each of the opening in the base isolation layer, the second extrinsic base layer, the central portion of the landing pad and the aperture in the first extrinsic base layer.

15. A method of forming a bipolar device on a substrate having a collector, comprising the steps of:
(a) forming an intrinsic base layer on said substrate;
(b) forming a first conductor above said intrinsic base layer, wherein said first conductor has a substantially uniform conductance throughout, wherein step (b) includes forming a first extrinsic base layer and silicidating said first extrinsic base layer prior to step (c) so as to form said first conductor;
(c) forming an emitter having at least a portion thereof extending over a portion of said first conductor; and
(d) forming a second extrinsic base layer above said first extrinsic base layer and performing a first etch through said second extrinsic base layer to said first extrinsic base layer and then performing a second etch through said first extrinsic base layer to said intrinsic base layer.

16. A method of forming a bipolar transistor, comprising:
providing a substrate having a surface and a collector pedestal formed in the substrate;
depositing an intrinsic base layer on the surface of the substrate, the intrinsic base layer having one of a p-type or n-type doping;
depositing a first extrinsic base layer over the intrinsic base layer, the first extrinsic base layer having the other of the p-type or n-type doping;
forming a conductive ring over the intrinsic base layer, the conductive ring having a center;
forming an aperture in the first extrinsic base layer in the center of the conductive ring;
forming an emitter having a lower portion located in the aperture in the first extrinsic base layer, and an upper portion extending over the conductive ring;
prior to said forming of the aperture in the first extrinsic base layer, oxidizing a portion of the first extrinsic base layer, wherein the aperture is formed in the portion oxidized so as to form an insulator ring for electrically insulating the conductive ring from the emitter; and
depositing an undoped silicon layer over the intrinsic base layer before said depositing of the first extrinsic base layer, wherein said forming of the aperture in the first extrinsic base layer includes utilizing the undoped silicon layer as an etch-stop.

17. A method according to claim 16, further comprising, prior to said forming of the conductive ring, forming a landing pad on the first extrinsic base layer at the location of the center of the conductive ring.

18. A method of forming a bipolar transistor, comprising:
providing a substrate having a surface and a collector pedestal formed in the substrate;
depositing an intrinsic base layer on the surface of the substrate, the intrinsic base layer having one of a p-type or n-type doping;
depositing a first extrinsic base layer over the intrinsic base layer, the first extrinsic base layer having the other of the p-type or n-type doping;
forming a conductive ring over the intrinsic base layer, the conductive ring having a center;
forming an aperture in the first extrinsic base layer in the center of the conductive ring;
forming an emitter having a lower portion located in the aperture in the first extrinsic base layer, and an upper portion extending over the conductive ring; and
prior to said forming of the conductive ring, forming a landing pad on the first extrinsic base layer at the location of the center of the conductive ring.

19. A method according to claim 18, wherein said forming of the emitter includes forming an emitter so that the lower portion further extends through each of the opening in the base isolation layer, the second extrinsic base layer, the central portion of the landing pad and the aperture in the first extrinsic base layer.

* * * * *